United States Patent [19]

Harvey et al.

[11] Patent Number: 4,523,182

[45] Date of Patent: Jun. 11, 1985

[54] PROM TRIMMED DIGITAL-TO-ANALOG CONVERTER

[75] Inventors: Barry Harvey; Robert C. Barry, both of Palo Alto, Calif.

[73] Assignee: Advanced Micro Devices, Inc., Sunnyvale, Calif.

[21] Appl. No.: 456,924

[22] Filed: Jan. 10, 1983

[51] Int. Cl.³ ............................................ H03K 13/02
[52] U.S. Cl. ...................... 340/347 DA; 340/347 CC
[58] Field of Search ................ 340/347 DA, 347 AD, 340/347 CC

[56] References Cited

U.S. PATENT DOCUMENTS

| 4,272,760 | 6/1981 | Prazak | 340/347 DA |
| 4,450,433 | 5/1984 | Moriyama | 340/347 DA |
| 4,465,996 | 8/1984 | Boyacigiller | 340/347 DA |

Primary Examiner—Charles D. Miller
Attorney, Agent, or Firm—Patrick T. King; J. Vincent Tortolano

[57] ABSTRACT

A digital-to-analog converter apparatus (DAC) includes internal PROM-controlled compensating converter means for precisely compensating values of lesser significant bits in accordance with scale factors which depend upon the binary input values of more significant bits and which are independent of compensation of the analog output signal value corresponding to the more significant bits. The converter apparatus employs programmable read-only memory (PROM) for decoding input digital values into digital compensation values which control internal digital-to-analog converter apparatus. An analog signal out of an internal compensating digital-to-analog converter apparatus is coupled to a summing junction and an analog scaling reference. The output of the summing junction generates a compensated analog scaling value signal which is fed to a reference terminal of a digital-to-analog converter apparatus which generates the analog signal representing the lesser significant bits.

14 Claims, 4 Drawing Figures

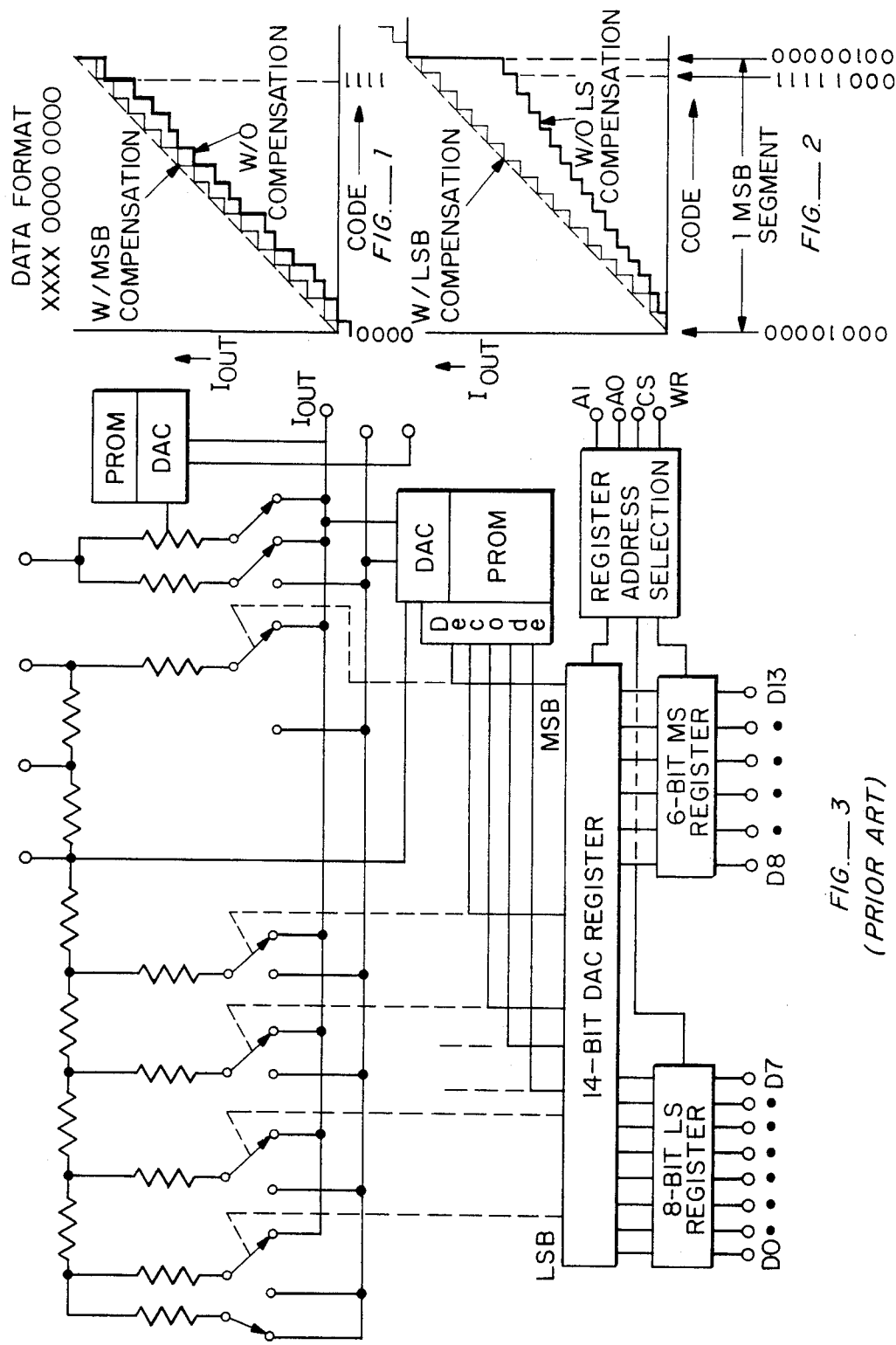

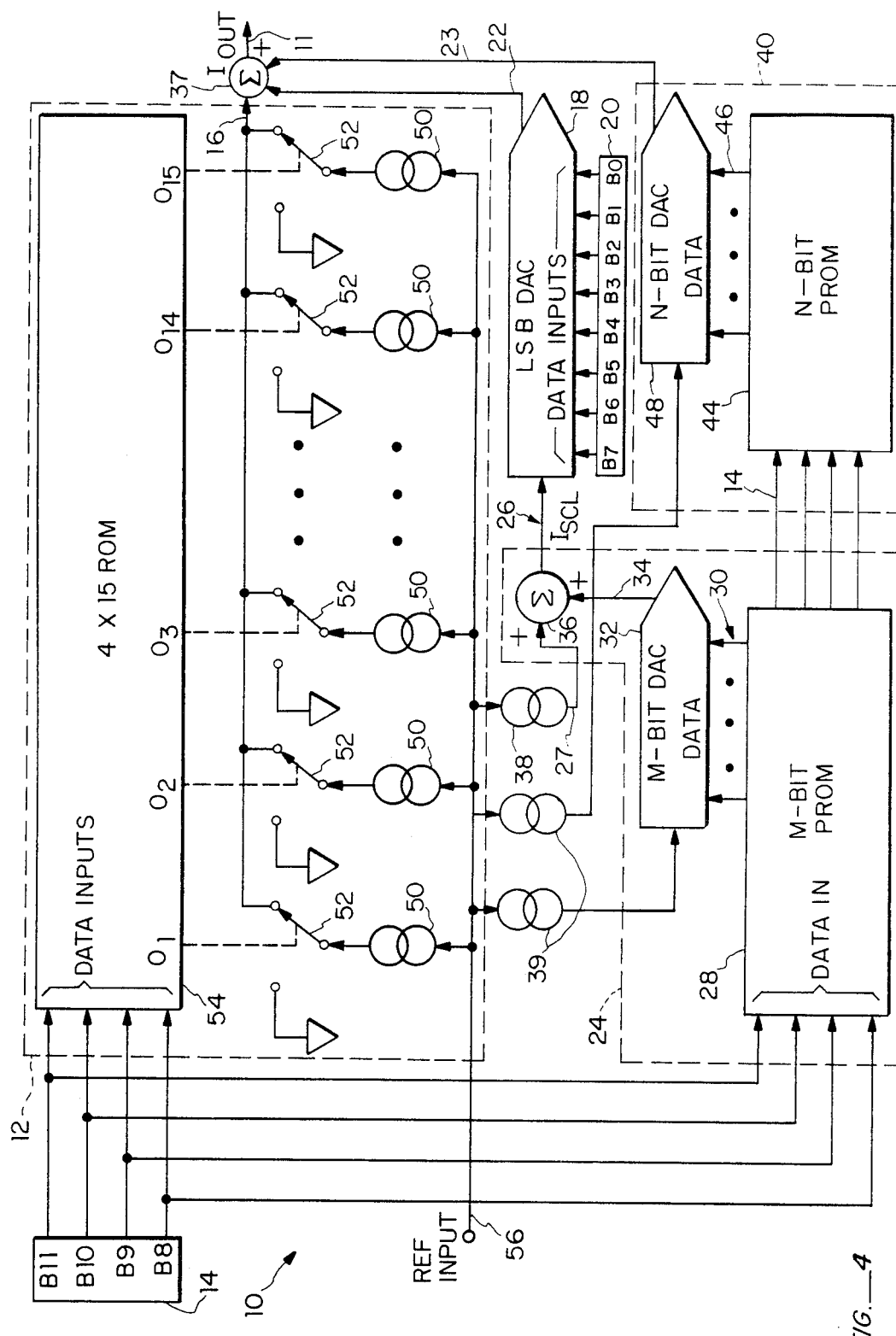
FIG._4

PROM TRIMMED DIGITAL-TO-ANALOG CONVERTER

BACKGROUND OF THE INVENTION

1. Field of Invention

This invention relates to digital-to-analog converters embodied in semiconductor integrated circuitry. In particular, this invention relates to a digital-to-analog converter (DAC) circuit adapted for simple, accurate and stable compensation of an analog output signal to conform with input binary number values.

A DAC has a variety of applications permitting the interchange of information between an analog environment of continuously variable parameters and a digital environment of discrete parameter values. A DAC is useful for producing a predictable analog signal level from a specified digital value represented by a set of binary-valued signals. The sum of currents, for example, digitally switched in parallel may determine the analog output signal value. One of the persistent problems associated with a DAC, particularly a DAC fabricated in an integrated circuit, is precision of calibration. Ideally, the analog output value of a DAC should correspond to its digital input value within one half part of the least significant bit ($\frac{1}{2}$ LSB) throughout the entire range of operation of the device. In a device having a 12-bit range, the accuracy of calibration is ideally at least one part in $2^{13}$. Analog circuitry having that degree of precision is not readily fabricated.

Integrated circuit fabrication has both advantages and disadvantages in the construction of a DAC. For example, it is possible to fabricate an integrated DAC having parameters which remain substantially stable relative to one another over a range of operating conditions. However, absolute parameters of integrated DACs may differ relative to one another, requiring trimming to bring the device into compliance with the desired degree of linearity. It is therefore desirable to provide a mechanism for compensating for fabrication uncertainties.

FIG. 1 illustrates one desired type of compensation, herein designated segment or MSB (for most significant bit) compensation. In MSB compensation, the mechanism provides for correction of selected most significant bits. The number of bits of correction depends on the maximum chosen size of the supporting memory. MSB compensation permits precisely calibrated encoding of digital data of the more significant bits wherever lesser significant bits have zero value. Therefore, MSB compensation provides an accurate baseline for higher precision compensation. For example, in a 12-bit device, the data format is XXXX00000000, where the four leading bits are the bit values defining an MSB code which determines the stepwise transition. FIG. 1 illustrates both the uncompensated and the compensated transfer characteristic for MSB compensation.

FIG. 2 illustrates a second and different type of compensation, herein designated LSB (for least significant bit) interpolation compensation, since it involves interpolation between consecutive MSB codes. In this technique, it is desired that the lesser significant bits align precisely with the slope between transitions of the greater significant bits. For example, in a 12-bit device, data of the format ABC011111111 must produce an analog output differing by $1 \pm \frac{1}{2}$ LSB from the analog output produced by data of the format ABC100000000 (where A, B and C are arbitrary binary values of the more significant bits). Absent such alignment, there will be significant and noticeable non-linearities. FIG. 2 illustrates both the uncompensated and the compensated transfer characteristic for LSB compensation.

In the past, LSB compensation has generally not been capable of providing non-uniform compensation as between consecutive MSB codes over the range of MSB values. In the typical prior art fabrication technique, a DAC is fabricated to provide an uncompensated output initially different from that desired. Compensation has been generally effected by cutting or trimming material from the circuit die with a laser, by cleaving fusible links, or by forcing large reverse currents through protection diodes to cause diode breakdown. Each of these techniques is intended to alter the analog current-carrying characteristic of bit-setting resistors. However, such techniques initially require a relatively large on-chip component area, specially designed equipment, and long trim time. In addition, such techniques generally are impractical after the device is packaged and burned in.

The inherent problems of on-chip analog compensation, such as laser trimming, have been recognized in the prior art. Specifically, an alternative technique has been suggested for segment compensation. The alternative technique involves the use of a Programmable Read Only Memory element (PROM) to control digitally current carrying elements. A monolithic 14-bit DAC manufactured under the designation ICL7134 by Intersil, Inc. of Cupertino, Calif. incorporates this technique. This device is illustrated in FIG. 3 and is described for example in Brubaker et al., "14-Bit DAC Mates With Microprocessors, Settles in Less Than 1 Microsecond." *Electronic Design*, Apr. 16, 1981, Page 147. In the ICL7134, there are provided multiple DACs on chip, an output DAC and a compensating DAC. The five most significant bits of the output DAC are compensated as in FIG. 1 herein by the programming of a PROM with correction codes which control the output of the compensating DAC. The scale factor is constant and the scale factor error cannot be corrected as between consecutive MSB codes. Thus the scale factor error is mapped though all MSB values. PROM programming involves the selection of one correction code for each combination of the most significant bits. FIG. 3 herein is a reproduction of a functional block diagram of the ICL7134 DAC from the cited article.

Other background on digital error correction is found in Prazak et al., "Correcting Errors Digitally in Data Acquisition and Control," *Electronics*, Nov. 22, 1979, Page 123. Some types of DACs not to be confused with the present invention are of a design which is not conducive to compensation. A patent of interest is Schoeff, U.S. Pat. No. 4,292,625 issued Sept. 29, 1981. The '625 patent describes a DAC having a segment generator for the more significant bits and a step generator for the lesser significant bits wherein the problem of segment carry is addressed. No trim type compensation is employed.

Other publications relating to the problems of calibration are Schoeff, "An Inherently Monotonic 12b DAC", 1979 IEEE International Solid-State Circuits Conference Digest of Technical Papers, Page 178, and Schoeff, "An Inherently Monotonic 12 Bit DAC", IEEE Journal of Solid-State Circuits, Volume SC-14 (December 1979), Page 904.

SUMMARY OF THE INVENTION

According to the invention, a digital-to-analog converter apparatus (DAC) includes internal PROM-controlled compensating converter means for precisely compensating values of the lesser significant bits (LSB) in accordance with scale factors which depend upon the values of the more significant bits (MSB) and independent of compensation of the values of the more significant bits. The converter apparatus employs a programmable read-only memory (PROM) for decoding input digital values into digital compensation values for controlling internal digital-to-analog converter subsystems. According to the invention, a compensating digital-to-analog converter (CDAC) controls a scale factor affecting the lesser significant bits for each value, or segment, of the more significant bits. An analog output signal of the second internal CDAC is coupled to a summing junction with a scaling reference. The output of the summing junction generates an analog scaling signal which is coupled to control an output DAC for the lesser significant bits. The analog output signal of the output DAC for the lesser significant factor is added to the analog output signal generated for the more significant bits.

An apparatus according to this invention has numerous advantages. First, the apparatus can be tested and trimmed by programming a PROM after assembly and burn-in. Therefore, assembly and burn-in distortion can be trimmed out to provide a highly stable, assembled package. Second, the apparatus can be temperature tested as an assembled package so that trimming can be optimized for the intended temperature range. Third, non-linear characteristics can be accurately programmed and calibrated. Fourth, since trimming can be performed after assembly, the combination of the apparatus and any external device can be jointly trimmed so that the combined system can be given a desired characteristic independent of device characteristics.

The other advantages of the invention will be apparent upon examination of a detailed description of the invention taken in connection with the accompanying drawings, a brief description of which follows.

BRIEF DESCRIPTION OF THE DRAWINGS

FIG. 1 is a graph of digital input value versus analog output value illustrated uncompensated and compensated MSB encoded information.

FIG. 2 is a graph of digital input value versus analog output value illustrating uncompensated and compensated LSB encoded information.

FIG. 3 is a block diagram of a prior art digital-to-analog converter apparatus having MSB compensation.

FIG. 4 is a block diagram of a digital-to-analog converter apparatus according to the invention.

DESCRIPTION OF SPECIFIC EMBODIMENTS

Referring to FIG. 4, there is shown a digital-to-analog converter apparatus 10 according to the invention which receives input binary number signals in two bit groups, namely first binary number signals representing bits of more significance than all other input binary signals (MSB signals 14) and second binary number signals representing bits of lesser significance than the MSB signals 14 (LSB signals 20). The digital-to-analog converter apparatus 10 accepts these MSB signals 14 and LSB signals 20 and converts the values thereof into an analog output signal 11. As shown herein, the digital-to-analog converter apparatus 10 is a 12-bit converter wherein the foremost significant bits, designated B11, B10, B9, B8, are the MSB signals 14 and the remaining bits, designated B7, B6, B5, B4, B3, B2, B1 and B0, are designated the LSB signals. The analog output signal 11 is provided as a current $I_{OUT}$ on an analog output signal line. For the convenience of reference, the designations of signal lines and signal names are interchangeable.

The digital-to-analog converter apparatus 10 according to the invention comprises at least three, and generally four, digital-to-analog converter subsystems. The analog output signals of the four digital-to-analog converter subsystems are summed in a novel manner to provide the resultant analog output signal 11. A first or MSB digital-to-analog converter means (MSB DAC) 12 is operative to receive the MSB signals 14 and to provide a first portion 16 of the analog output signal 11, and a second or LSB digital-to-analog (LSB DAC) 18 is operative to receive the LSB signals 20 and to provide a second portion 22 of the analog output signal 11 over signal lines 16 and 22 through an output summing junction means 37.

According to the invention, means 24 are provided for supplying a compensated analog scaling value signal 26 to the LSB DAC 18 to compensate for step errors over the range of the second portion 22 of the analog output signal 11 in response to the LSB signals 20 (step compensating means 24). It is understood that the LSB DAC 18 is responsive to some analog scaling signal to modify the rate of change of the converted signal in response to the input binary signal. In accordance with the invention, the rate of change is dependent on the value of the MSB signals 14 received by the MSB step compensating means 24 according to the invention. In a specific embodiment, as shown in FIG. 4, an analog scaling value signal 27 is supplied through a first controlled current source 38 to a first summing junction means 36. The first summing junction means 36 adds an analog scaling compensation signal 34 to the analog scaling value signal 27 to produce the compensated analog scaling value signal 26.

According to the invention, the analog scaling compensation signal 34 is generated by a third digital-to-analog converter means or LSB compensation DAC 32. The scaling of the output signal of the LSB compensation DAC 32 is provided by a second controlled current source 39, the output of which is coupled to a scaling input of the LSB compensation DAC 32. The digital input control to the LSB compensation DAC 32 is provided by third binary signals 30 which are supplied by a digital memory means 28. The digital memory means 28 is specifically a programmable read-only memory (PROM) or the like which is coupled to receive the MSB signals 14 and which is operative to interpret the MSB signals 14 as an address designating a preselected value of the third binary signals 30 intended to generate the analog scaling compensation signal 34 through the LSB compensation DAC 32. The value for the third binary signals 30 may be determined experimentally after assembly, burn in and investigation of the amount of error which persists in the output of the LSB DAC 18 at the highest significant bit level of the LSB signals 20 for the particular MSB signal value. The resolution of the LSB compensation DAC 32 can be selected to be any reasonable value. For example, the LSB compensation DAC 32 may be a 2-bit, 4-bit or even 8-bit converter. A 4-bit converter, for example, is capable of producing sixteen discrete levels of compensation to add to the analog scaling value signal 27.

In addition, the DAC apparatus 10 according to the invention may include means 40 for supplying a third portion 23 of the analog output signal 11 in response to MSB signals 14. It may comprise a fourth digital-to-analog converter means, designated herein a segment compensation DAC 48, coupled to receive fourth binary number signals 46 from a second digital memory means 44. The second digital memory means 44 is coupled to receive the MSB signals 14. The data output in the former of the fourth binary number signals 46 is preselected to correspond with the analog third portion signal 23 which supplies any needed segment correction to the analog output signal 11. The first portion 16, second portion 22 and third portion 23 are added as currents at the output summing junction means 37.

In a specific embodiment wherein the MSB signals 14 represent sixteen discrete signal levels, there is provided a main output DAC supplying the first portion 16 of the analog output signal which consists of fifteen equal current segments 50, each coupled through a current switch 52 to a common node with the second summing junction 37. Each one of the current switches 52 is operated under control of a third digital memory means 54 which is coupled to receive the MSB signals 14. The third digital memory means 54 may be a read-only memory (ROM), the read-only memory being operative to establish the number and physical distribution of segment currents 50 which are switched to connect to the common node with the second summing junction 37. These fifteen segments may be equal in magnitude and account for the fifteen most significant levels of the MSB signals. The sixteenth level is distributed over the range of the LSB DAC 18, the output of which is added at the output summing junction means 37.

Programmed read-only memory trimming in accordance with the present design is particularly adapted to segmented type digital-to-analog converters, since the use of equal segments reduces the individual segment accuracy requirements and enhances stability over temperature. An external reference can be provided at a scaling or reference input 56, which controls the initial current setting of each of the segments 50, 38 and 39. It should be recognized that the segments 39 is of considerably smaller capacity than the segments 50 or 38, since the current level employed for scaling is for use only to compensate for segment or step error.

The invention is particularly useful to correct for changes in slope from segment to segment, for example, in a device representing a non-linear transfer function. A highly stable non-linear transfer function can be effected employing a converter apparatus according to the invention.

In a method according to the invention, an apparatus having the designated functions generates a compensated analog scaling value signal in response to MSB signals wherein the magnitude of the compensated analog scaling value signal is preselected by digital memory means for each value of the MSB signal and wherein the compensated analog scaling value signal is provided to an LSB DAC to correct for errors in the analog output of the LSB DAC. It is important to note that this invention involves the summing of an analog scaling compensation signal with an analog scaling value signal to produce a compensated analog scaling value signal which controls the slope or rate of change of the analog output signal of the LSB DAC 18 in response to LSB compensating signals at the input of the LSB DAC 18, the LSB compensating signals being provided in response to MSB signals received by a PROM.

The invention has been described with reference to specific embodiments. Other embodiments will be apparent to those of ordinary skill in the art. It is therefore not intended that this invention be limited except as indicated by the appended claims.

We claim:

1. In an apparatus for converting input binary number signals into an analog output signal, said apparatus having means for converting first binary number signals of said input binary number signals into a first portion of said analog output signal, said first portion corresponding in value to said first binary number signals, said first binary number signals representing bits of more significance than all other input binary number signals (MSB signals) and having means for converting second binary number signals of said input binary number signals into a second portion of said analog output signal, said second binary number signals representing bits of lesser significance than said MSB signals (LSB signals), means for compensating for error in said LSB signals for each value of said MSB signals comprising:
  means coupled to receive said MSB signals for supplying a compensated analog scaling value signal to said second binary signal converting means to compensate for step errors over the range of the second portion of the analog output signal.

2. In the apparatus according to claim 1 wherein said means for supplying said compensated analog scaling value signal includes a first digital memory means coupled to receive said MSB signals and in response to said MSB signals to provide third binary number signals, said third binary number signals for controlling said compensated analog scaling value signal.

3. In an apparatus according to claim 2 further including a first digital-to-analog converter means operative to receive said third binary number signals and to provide an analog scaling compensation signal, further including a summing junction means coupled to receive said analog scaling compensation signal and a scaling value signal, wherein said analog scaling compensation signal and said scaling value signal provide as a sum said compensated analog scaling value signal to said second binary signal converting means.

4. In the apparatus according to claim 3 further including means coupled to receive said MSB signals and responsive to said MSB signals for providing a third portion of said analog output signal as compensation of said first portion of said analog output signal.

5. In the apparatus according to claim 4, wherein said MSB signal compensation means comprises:
  a second digital memory means responsive to said MSB signals to provide fourth binary number signals; and
  a second digital-to-analog converter means coupled to receive said fourth binary number signals and operative to control (said third) portion of said analog output signal, said third portion being added to said first portion.

6. In an apparatus according to claim 5, wherein values of said fourth binary number signals of said second digital memory means are preselectable.

7. In an apparatus according to claim 3, wherein values of said third binary number signals of said first digital memory means are preselectable.

8. An apparatus for converting input binary number signals into an analog output signal comprising:
   a first digital-to-analog converter means (DAC);
   a second digital-to-analog converter means (DAC);
   a third digital-to-analog converter means (DAC);
   a fourth digital-to-analog converter means (DAC);
   a first analog signal summing junction means having an output terminal and coupled to receive from said first DAC, from said second DAC, and from said third DAC a first portion, a second portion, and a third portion, respectively, of said analog output signal for providing to said output terminal said analog output signal;
   a second analog signal summing junction means coupled to receive an analog scaling value signal and an analog scaling compensation signal for providing as a sum a compensated analog scaling value signal to said second DAC; and
   a digital memory means;
   wherein said first DAC is coupled to receive first binary number signals of said input binary number signals representing bits of more significance than all other input binary number signals (MSB signals) for providing said first portion of said analog output signal to said first summing junction means;
   wherein said second DAC is coupled to receive second binary number signals of said input binary number signals representing bits of lesser significance than said MSB signals (LSB signals) for providing said second portion of said analog output signal to said first summing junction means;
   wherein said fourth DAC is coupled to receive third binary number signals from said digital memory means for providing said third portion of said analog output signal to said first summing junction means;
   wherein said digital memory means is coupled to receive said MSB signals as input signals for providing fourth binary number signals preselected to compensate for conversion error in said first DAC such that a sum of said first portion and said second portion corresponds in value to said MSB signals; and
   wherein said third DAC is coupled to receive fifth binary number signals from said digital memory means for providing said analog scaling compensation signal to said second summing junction means, said digital memory means further for providing sixth binary number signals preselected to compensate for conversion error in said second DAC in response to said MSB signals such that, for each one of said MSB signals, a sum of said analog scaling compensation signal and said analog scaling value signal provides correct scaling so that said second portion of said analog output signal correponds in value to said LSB signals for each one of said MSB signals.

9. An apparatus according to claim 8 wherein said memory means is a read-only memory having preselectable data values, said data values defining said fourth binary number signals and said sixth binary number signals.

10. An apparatus according to claim 8 further including means for providing an analog scaling value signal in response to a reference signal external of said apparatus.

11. An apparatus according to claim 8 wherein said first digital-to-analog converter means includes:
   a plurality of controlled current source means;
   means for connecting said controlled current source means to said first summing junction means; and
   means coupled to said connecting means for selecting among said connecting means in response to said MSB signals.

12. In an apparatus for converting input binary number signals into an analog output signal, said apparatus having means for converting first binary number signals of said input binary number signal into a first portion of said analog output signal, said first portion corresponding in value to said first binary number signals, said first binary number signals representing bits of more significance than all other input binary number signals (MSB signals) and having means for converting second binary number signals of said input binary number signals into a second portion of said analog output signal, said second portion representing bits of lesser significance than said MSB signals (LSB signals), said second binary number converting means including means for scaling said second portion in response to an analog signal, a method for compensating for error in said LSB signals for each value of said MSB signals, said method comprising steps of:
   generating a compensated analog scaling value signal in response to said MSB signals, the magnitude of said compensated analog scaling value signal being preselected for each value of said MSB signals for correcting for errors in said second portion of said analog signal; and
   providing said compensated analog scaling value signal to said second binary signal converting means to correct for errors in said second portion of said analog signal.

13. A method according to claim 12 wherein said generating step further comprises directing third binary number signals from a digital memory means to a digital-to-analog converter means in response to said MSB signals, and producing an analog scaling compensation signal in response to said third binary number signals.

14. A method according to claim 13 wherein said providing step further comprises directing said analog signal compensation signal to a summing junction means, said summing junction means being operative to receive also an analog scaling signal from a fixed source external of said apparatus.

* * * * *